March 10, 1959 H. K. HENISCH 2,877,309
HALL EFFECT AMPLIFIER
Filed April 18, 1956

INVENTOR.
HEINZ K. HENISH
BY Theodore Jay Jr.
ATTORNEY

United States Patent Office
2,877,309
Patented Mar. 10, 1959

2,877,309

HALL EFFECT AMPLIFIER

Heinz K. Henisch, Flushing, N. Y., assignor to Sylvania Electric Products Inc., a corporation of Massachusetts Application April 18, 1956, Serial No. 578,959
4 Claims. (Cl. 179—171)

Figure 1:
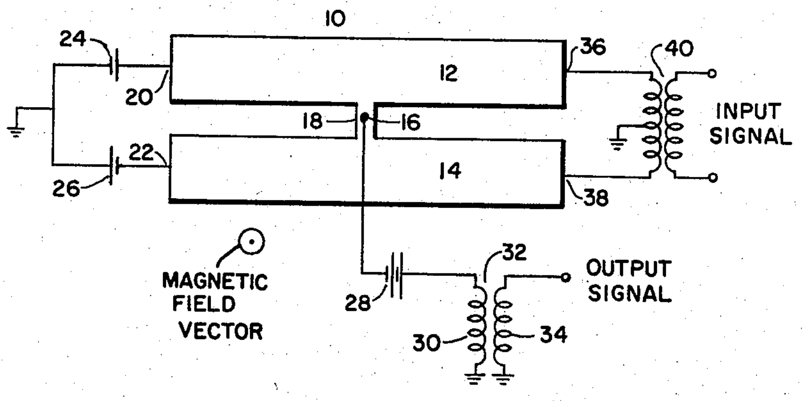

My invention is directed to electric circuits which utilize semiconductor elements and which employ the Hall effect.

Certain semiconductor bodies contain minority charge carriers. When an electric field is established within such a body, an electric force will be exerted on these carriers, urging them to drift in a direction parallel to the direction of the electric field. When a magnetic field is established within the body, a magnetic force will deflect the carriers in a direction at right angles to the direction of drift.

When the specimen is a narrow, elongated, thin body, and the electric field direction coincides with the direction of elongation while the magnetic field acts in a direction perpendicular to the direction of elongation, the minority carriers will migrate toward one of the two opposite sides of the body. When the field intensities are held fixed, a steady state will be established at which there will be a concentration of carriers at one side of the body and a corresponding deficiency of carriers at the opposite side. Consequently, a potential difference is developed between the two sides which gives rise to a displacement voltage called the Hall voltage. The phenomenon which produces this displacement voltage is called the Hall effect.

The prior art has knowledge of amplifier circuits which utilize semiconductor elements and which employ the Hall effect.

I have discovered a new type of circuit which also employs the Hall effect but which is more sensitive and provides a higher degree of amplification than such known circuits.

Accordingly, it is an object of the present invention to increase the sensitivity of an electric circuit employing the Hall effect.

Another object is to increase the amplification factor of an amplifier employing the Hall effect.

Still another object is to provide a new and improved electric circuit which utilizes semiconductor elements and which employs the Hall effect.

These and other objects of my invention will either be explained or will become apparent hereinafter.

In my invention there is provided first and second parallel elongated members or legs and a third member or cross bar portion interconnecting the legs to form an integral H-shaped structure. The structure is composed, for example, of N or P type semiconductor material. The third member contains a main p-n junction.

This p-n junction is back biased. Means coupled to both legs and responsive to an incoming amplitude modulated signal cause charge carriers to flow within each leg, the carriers in one leg flowing in a direction opposite to the direction of flow in the other leg.

A magnetic field is established within the structure which acts in a direction perpendicular to both directions of carrier flow and thus produces a Hall effect. As a result of the Hall effect, the carriers in each leg are concentrated about the main p-n junction. These carriers produce a current flow through the junction. When the magnetic field intensity is held constant, the current flow through the p-n junction represents, in amplified form, the amplitude variations in the applied signal. The amplification factor increases as the intensity of the field is increased.

Since the Hall effect produces a region of carrier concentration in each leg, it also must produce a region of carrier deficiency in each leg. I further provide two additional p-n junctions, each junction being positioned in a corresponding carrier deficient region in each leg. When the Hall effect increases the carrier concentration in the region of the main p-n junction, it also increases the carrier deficiency in the region of the additional p-n junctions. As a result, the current flow through the p-n junction in the first and second members is decreased and at the same time the current flow through the main p-n junction is increased. Voltage changes produced by these variations in current flow can be added together in such manner that the amplification factor and sensitivity established by the use of the three p-n junctions is accentuated as compared to the amplification and sensitivity obtained with the use of one main p-n junction.

Figure 2:
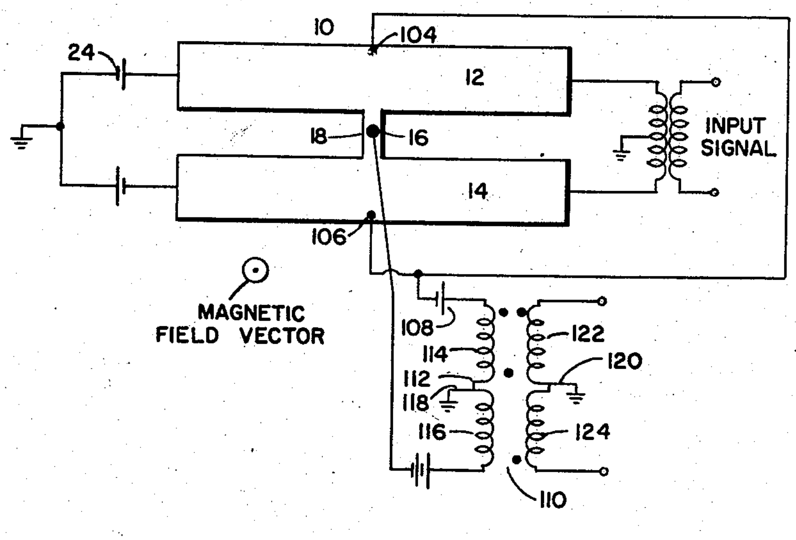

Illustrative embodiments of my invention will now be described in detail with reference to the accompanying drawing, wherein:

Fig. 1 illustrates a first embodiment of my invention and Fig. 2 illustrates a second embodiment thereof.

Referring now to Fig. 1, there is provided a thin H-shaped structure 10 formed from N type semiconductor material, and containing upper and lower legs 12 and 14 separated from each other by a narrow cross bar section 16. Section 16 contains a p-n junction 18 separated from both legs. Ends 20 and 22 of legs 12 and 14 are connected through oppositely connected batteries 24 and 26 to ground. P-n junction 18 is back biased by battery 28; the terminal battery 28 remote from this junction is coupled through a primary winding 30 of transformer 32 to ground.

First and second incoming amplitude modulated signals are applied in push-pull relation to ends 36 and 38 of legs 12 and 14 through transformer 40. A magnetic field is established within the structure 10 in a direction perpendicular both to the legs and the cross bar section 16.

Under the influence of the applied signals, and in the absence of the magnetic field, the negatively charged carriers (electrons in the upper leg 12 of structure 10 travel from right to left, while the like charged carriers in the lower leg 14 travel from left to right. At the same time, the positively charged carriers (holes) in upper leg 12 travel from left to right, while the like charged carriers travel in the lower leg in the reverse direction.

When the magnetic field is present, however, the directions of carrier flow are changed. The carriers in the both legs are concentrated in a region about p-n junction 18. As a result, the carriers so concentrated flow through the junction, and an output voltage proportional to the carrier flow appears across the secondary winding 34 of transformer 32. For a fixed magnetic field intensity, the output voltage is approximately proportional to the incoming signal; as the field intensity increases, the magnitude of the output voltage increases.

Since the Hall effect produces regions of carrier deficiency as well as regions of carrier concentration, each of legs 12 and 14 has a region of carrier deficiency. Additional p-n junctions 104 and 106 are positioned in these regions as shown in Fig. 2. These additional p-n junctions are connected in parallel and are back biased by battery 108.

When transformer 40 is replaced by a resistor having its midpoint grounded, and D. C. signals having identical magnitudes and opposed polarities are supplied at opposite ends of the resistor, the device shown in Fig. 1 can operate as a D. C. amplifier.

It will be apparent from a consideration of Fig. 2 that the additional p-n junctions are coupled to the upper half 114 of the primary winding 112 of transformer 110, while the original p-n junction is connected to the lower half 116 of this winding. These upper and lower half sections 114 and 116 have the polarities indicated. The center tap 118 of primary winding is grounded. Coupled to this primary winding is a secondary winding 120 having upper and lower half sections 112 and 124 polarized in opposite sense as indicated in the drawing.

In this arrangement when the Hall effect is present, an increase in the current flow in the original p-n junction also results in a corresponding decrease in the current flow through the additional p-n junctions. Due to the action of transformer 110, the output voltage produced across the secondary winding 120 is proportional to the change in voltage produced across the half winding 114 by the increase in current flow in the original p-n junction as augmented by the voltage produced across winding 116 by the decrease in the current flow in the additional p-n junction, thus accentuating the Hall effect and further increasing the amplification factor of the device.

While I have shown and pointed out my invention as applied above, it will be apparent to those skilled in the art that many modifications can be made within the scope and sphere of my invention as defined in the claims which follow.

What is claimed is:

1. In combination, an H-shaped element composed of semiconductor material, the cross bar section of said element containing a p-n junction, said p-n junction being back biased, said element except for said junction having a predetermined polarity conductivity; means coupled to both legs of said element to cause charge carriers to flow within each leg, the carriers in one leg flowing in a direction opposite to the direction of flow in the other leg; and means to establish a magnetic field within said element, said field acting in a direction at which a Hall effect is produced and certain of said carriers are forced through said junction.

2. A Hall effect amplifier comprising an H-shaped element having a first plane of symmetry which extends between and is parallel to the arms of said element and a second plane of symmetry which extends along the central portion of said element, said element being formed from semiconductor material, the cross bar portion of said element containing a p-n junction, said element except for said junction having a predetermined polarity conductivity; means coupled to the arms of said elements to produce currents of equal magnitude in each arm, the direction of current flow in the one arm being opposite to the direction of current flow in the other arm, the paths of current flow in both arms being parallel to said first plane; means to establish a magnetic field in said element, said field acting in a direction parallel to both planes; and means to back bias said p-n junction, the Hall effect established by said field decreasing the current flow in said arms and increasing the current flow through said junction, the Hall effect increasing as the intensity of said field is increased.

3. A Hall effect amplifier comprising an H-shaped semiconductor element provided with a pair of parallel legs and a central member interconnecting said legs, said member containing a p-n junction, said junction being back biased, said element being responsive to an applied amplitude varying signal to produce a current flow in each leg, the currents in both legs having equal magnitudes and flowing in opposite directions; and means to establish a magnetic field within said element, said field acting in a direction at which a Hall effect is produced, whereby the current flow in said legs is diminished and a Hall effect current flows through said junction, said current when the field intensity is constant, varying in accordance with the amplitude variations in said signal.

4. A Hall effect amplifier comprising an H-shaped semiconductor element provided with a pair of parallel legs and a central member interconnecting said legs, said member and each of said legs each containing a separate p-n junction, said junctions being back biased, said element being responsive to an applied amplitude varying signal to produce a current flow in each leg, the currents in both legs having equal magnitudes and flowing in opposite directions; and means to establish a magnetic field within said element, said field acting in a direction at which a Hall effect is produced, whereby the current flow in said legs is diminished and a Hall effect current flows through the junction of said member, said current when the field intensity is constant, varying in accordance with the amplitude variations in said signal.

References Cited in the file of this patent

UNITED STATES PATENTS

| | | |
|---|---|---|
| 2,666,814 | Shockley | Jan. 19, 1954 |
| 2,736,822 | Dunlap | Feb. 28, 1956 |
| 2,794,863 | Van Roosbroeck | June 4, 1957 |